United States Patent
Chiu

(10) Patent No.: US 11,304,333 B2
(45) Date of Patent: Apr. 12, 2022

(54) ACCOMMODATING SYSTEM, AND FILLING METHOD FOR ACCOMMODATING SYSTEM

(71) Applicant: Quanta Computer Inc., Taoyuan (TW)

(72) Inventor: Ta-Chuan Chiu, Taoyuan (TW)

(73) Assignee: QUANTA COMPUTER INC.

(*) Notice: Subject to any disclaimer, the term of this patent is extended or adjusted under 35 U.S.C. 154(b) by 0 days.

(21) Appl. No.: 17/026,609

(22) Filed: Sep. 21, 2020

(65) Prior Publication Data

US 2022/0015264 A1 Jan. 13, 2022

(30) Foreign Application Priority Data

Jul. 13, 2020 (TW) .................................. 109123502

(51) Int. Cl.
 F28D 20/00 (2006.01)
 H05K 7/20 (2006.01)
 F28D 20/02 (2006.01)

(52) U.S. Cl.
 CPC ....... *H05K 7/20281* (2013.01); *F28D 20/028* (2013.01); *H05K 7/20272* (2013.01)

(58) Field of Classification Search
 None
 See application file for complete search history.

(56) References Cited

U.S. PATENT DOCUMENTS

| | | | |
|---|---|---|---|
| 9,250,024 B2* | 2/2016 | Campbell | F28D 15/02 |
| 9,313,920 B2* | 4/2016 | Campbell | F28B 3/04 |
| 10,765,033 B1* | 9/2020 | Keehn | H05K 7/20236 |
| 10,808,973 B2* | 10/2020 | Schoonen | F25B 43/006 |
| 10,813,239 B2* | 10/2020 | Ganz | H05K 7/20936 |
| 10,974,955 B2* | 4/2021 | Shock | B67D 7/62 |
| 11,064,631 B2* | 7/2021 | So | H05K 7/203 |
| 2004/0008483 A1* | 1/2004 | Cheon | G06F 1/20 361/679.53 |
| 2011/0026225 A1* | 2/2011 | Ostwald | H05K 7/20781 361/699 |
| 2017/0064862 A1* | 3/2017 | Miyoshi | H01L 21/67109 |
| 2017/0314511 A1 | 11/2017 | Yudanov | |
| 2020/0288598 A1* | 9/2020 | Mehravaran | H05K 7/20863 |

FOREIGN PATENT DOCUMENTS

CN 107000581 B 6/2020

OTHER PUBLICATIONS

Chinese language office action dated Dec. 16, 2021, issued in application No. TW 109123502.

* cited by examiner

*Primary Examiner* — Courtney L Smith
(74) *Attorney, Agent, or Firm* — McClure, Qualey & Rodack, LLP

(57) ABSTRACT

A filling method for an accommodating system is provided. The filling method includes filling a liquid into an accommodating device at a first temperature, and withdrawing a predetermined amount of the liquid from the accommodating device using a pump. The predetermined amount is related to a temperature change.

16 Claims, 2 Drawing Sheets

ACCOMMODATING SYSTEM, AND FILLING METHOD FOR ACCOMMODATING SYSTEM

CROSS-REFERENCE TO RELATED APPLICATIONS

The present application claims priority of Taiwan Patent Application No. 109123502, filed on Jul. 13, 2020, the entirety of which is incorporated by reference herein.

BACKGROUND OF THE DISCLOSURE

Field of the Disclosure

This disclosure relates in general to a filling method and an accommodating system, and in particular it relates to a filling method and an accommodating system for coolant.

Description of the Related Art

The computing engine or data processing unit of a self-driving car requires a high-performance computing core and hardware, and it derives a demand that is a high-performance heat dissipation system. In order to meet the requirements of environment for vehicles and high-efficiency heat dissipation, water cooling systems have become widely adopted in vehicle design. Because of separate hardware design, a cooling system often needs to be integrated into the hardware system of the car so as to be a part of the hardware system and be transported together with the hardware system. It is then assembled at a subsequent vehicle assembly plant. As for whether or not the coolant for heat dissipation is pre-filled in the system and transported together, it is divided into two categories according to the business model requirements and the actual designs: filled with coolant and without coolant. The former is the environment in which the present invention is applied, and the demand for filling coolant from the terminal factory is for reducing or avoiding the need to erect a whole set of coolant-filling apparatuses.

When the coolant is filled in a closed system, variations between the high and low temperature during transportation may result in thermal expansion and contraction. Thus during transportation, the expanded coolant may cause the housing of the coolant accommodating device to deform, which can result in damage to the coolant accommodating device, or liquid leakage, and this is a common problem in the industry.

BRIEF SUMMARY OF THE DISCLOSURE

The present invention calculates the ratio of the volume of the coolant to be filled to the volume of the coolant container based on the input environmental parameters, to ensure that environmental changes during the transportation will not cause leakage until assembled in the terminal factory, which consumes no or very less coolant. Since the leak-proof elements may not be reused, the present invention which eliminates the need for additional leak-proof elements may further reduce costs by eliminating these additional leak-proof elements.

A filling method for an accommodating system is provided, including: filling a liquid into an accommodating device at a first temperature; and withdrawing a predetermined amount of the liquid from the accommodating device using a pump. The predetermined amount is related to a temperature change sensed by a temperature sensor.

An accommodating system is provided, including: an accommodating device, and a liquid. The accommodating device has a liquid accommodating chamber volume and a liquid accommodating chamber volumetric thermal expansion coefficient; and a liquid. The liquid has a liquid volume and a liquid volumetric thermal expansion coefficient, and the liquid is accommodated in the accommodating device. The liquid volume is related to a temperature change.

BRIEF DESCRIPTION OF THE DRAWINGS

In order to describe the ways in which the foregoing disclosure and its advantages and features may be obtained, a more detailed description of the above principles is presented by referring to the specific examples shown in the following figures. These figures only depict the exemplary aspects of this disclosure, and therefore should not be regarded as a limitation on the scope of this disclosure. These principles are described and explained with additional features and details by using the following diagrams.

DETAILED DESCRIPTION OF THE DISCLOSURE

The present disclosure is described with reference to the accompanying drawings, in which the same symbols are used throughout the drawings to indicate similar or identical elements. The drawings are not drawn to scale, and the drawings provided are only used to illustrate this disclosure. The following describes several aspects of the disclosure with reference to example applications for illustration. It should be noted that many specific details, relationships, and methods are explained to provide a complete understanding of this disclosure. However, a person with ordinary skill in the art to which the present disclosure belongs will easily understand that the present disclosure may be practiced without having one or more specific details or in other ways. In other cases, well-known structures or operations are not shown in detail to avoid obscuring the present disclosure. The present disclosure is not limited to the sequence of operations, steps, actions, or events that are shown, because some operations, steps, actions, or events may occur in a different order and/or simultaneously with other operations, steps, actions, or events. In addition, all the illustrated operations, steps, actions, or events are not required to apply the method according to the present disclosure. Moreover, certain operations, steps, actions, or events may be omitted or deleted without affecting the implementation of this disclosure.

Unless otherwise defined, all of the terms used herein (including technical and scientific terms) have the same meanings as commonly understood by a person with ordinary skill in the art to which the present disclosure belongs. In addition, unless explicitly defined herein, the terms (such as, the terms defined in commonly used dictionaries) should be interpreted as having a meaning consistent with the context of the relevant field, and the terms should not interpret in idealized or too formal ways. In addition, unless otherwise stated, when "about", "approximately", "substantially", "roughly", etc. are used to describe a number or a range of numbers, the terms are intended to include numbers within ±10% of the stated number. For example, the term "about 5 mm" includes a size range of 4.5 mm to 5.5 mm. Moreover, as discussed herein, the phrases "about the same", "approximately", "substantially the same", and "roughly the same" may refer to sizes that have a variation within ±10% of the basic size.

Figure 1:
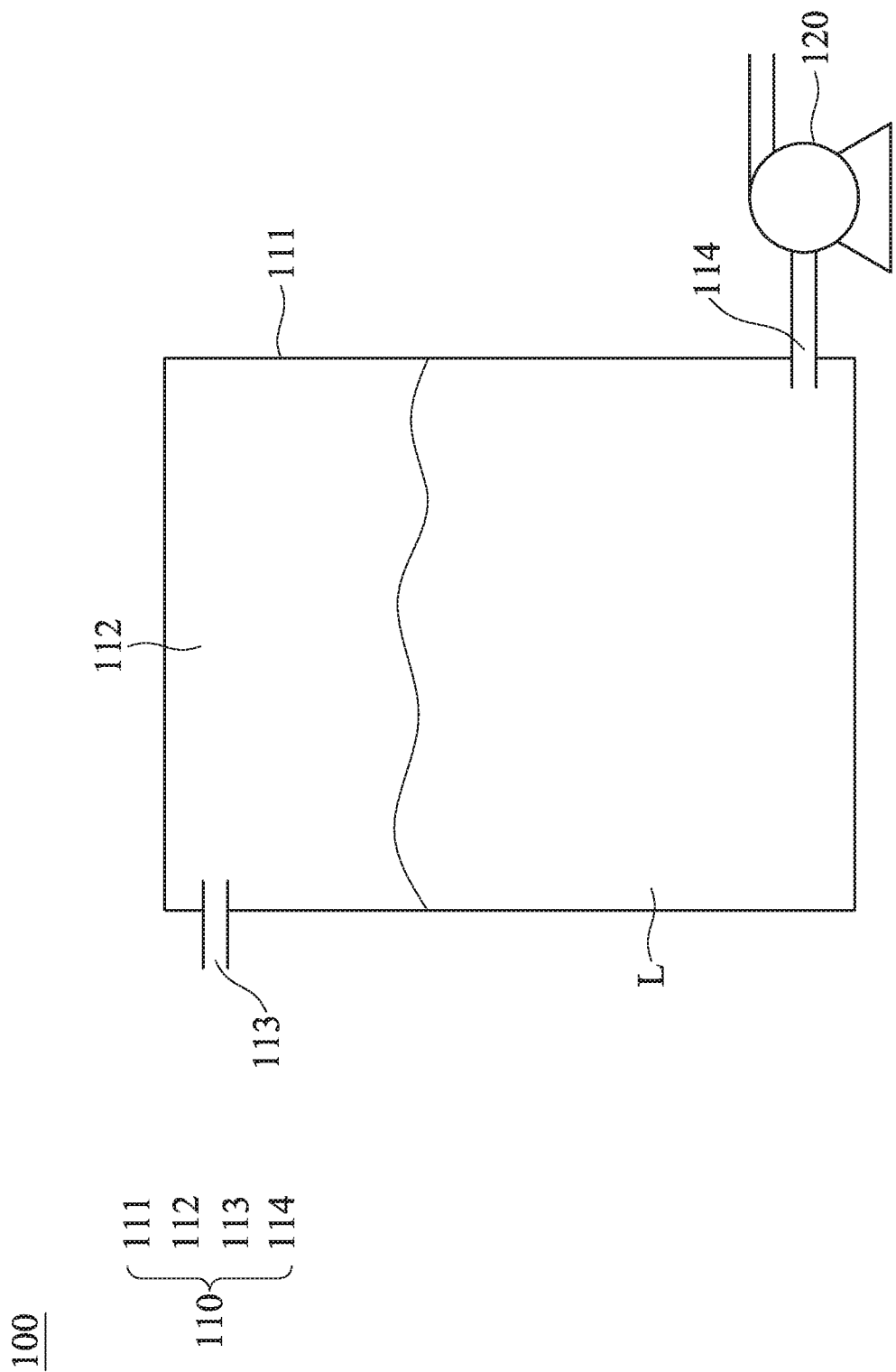
FIG. 1 shows a schematic view of an accommodating system according to some embodiments of the present disclosure.

Please refer to FIG. 1, FIG. 1 shows an accommodating system 100 according to some embodiments of the present disclosure. The accommodating system 100 may include an accommodating device 110, a pump 120, and a liquid L. The liquid L is accommodated in the accommodating device 110. The accommodating device 110 may be any suitable accommodating device that may accommodate the liquid L. For example, the accommodating device 110 may be a storage tank, a bottle, a pipeline, a conduit, or a combination thereof.

The accommodating device 110 may include a housing 111, a liquid accommodating chamber 112, a liquid inlet 113, and a liquid outlet 114.

The housing 111 surrounds the liquid accommodating chamber 112 to avoid the liquid accommodating chamber 112 from being fluidly communicated with the outside. The housing 111 may be made of any suitable materials. For example, in this embodiment, the housing 111 may be made of metals such as aluminum.

The liquid accommodating chamber 112 has a liquid accommodating chamber volume and a liquid accommodating chamber volumetric thermal expansion coefficient.

The liquid inlet 113 may fluidly communicate the liquid accommodating chamber 112 to an external source (not shown). The external source may supply the liquid L to the liquid accommodating chamber 112 by making the liquid L to flow through the liquid inlet 113.

The liquid outlet 114 may fluidly communicate the liquid accommodating chamber 112 to the outside, so as to supply the liquid L to the outside by making the liquid L to flow through the liquid outlet 114.

The pump 120 may be any suitable pumps that are suitable for pumping the liquid L out of the accommodating device 110. For example, in this embodiment, the pump 120 may be a vacuum pump 120. The pump 120 may keep the liquid accommodating chamber 112 sealed while making the liquid L to flow through the liquid outlet 114 to the outside, and prevents external air from flowing into the accommodating device 110 and the liquid accommodating chamber 112. Therefore, the accommodating device 110 accommodates no external air. Thus, the pressure in the liquid accommodating chamber 112 may be less than the external pressure after pumping the liquid L out of the accommodating device 110 using the pump 120.

The liquid L may be accommodated in the liquid accommodating chamber 112, and the liquid L has a liquid volumetric thermal expansion coefficient. The liquid L may be any suitable liquid. For example, in this embodiment, the liquid L may be water, ethylene glycol, or a mixed solution thereof (for example, a 50% ethylene glycol aqueous solution by volume), etc.; or, the liquid L may be a coolant.

It may be known from the concept of volumetric thermal expansion that after the liquid accommodating chamber 112 and the liquid L at a first temperature (initial temperature) undergo a temperature change, the volume of the liquid accommodating chamber 112 and the liquid L will change accordingly, the formula for which is shown below. Please note that the temperature change may be sensed by a temperature sensor. The relationship between the defined names and the representative symbols in the formula are listed in Table 1 below.

TABLE 1

| Defined name | Representative symbol |
| --- | --- |
| Liquid accommodating chamber volume | $V_A$ |
| Change of the liquid accommodating chamber volume | $\Delta V_A$ |
| Liquid accommodating chamber volumetric thermal expansion coefficient | $V_{A,E}$ |
| Liquid volume | $V_L$ |
| Change of the liquid volume | $\Delta V_L$ |
| Liquid volumetric thermal expansion coefficient | $V_{L,E}$ |
| Temperature change | $\Delta T$ |
| First temperature | $T_1$ |
| Second temperature | $T_2$ |
| Third temperature | $T_3$ |

It should be particularly noted that the above-mentioned liquid accommodating chamber volume $V_A$ refers to the volumetric space in the liquid accommodating chamber 112 that may be filled with liquid.

In several embodiments, the first temperature ($T_1$) may be the room temperature (before shipping, such as 25° C.) of the location of the accommodating system 100, the second temperature ($T_2$) may be a highest temperature (such as 85° C., 100° C., or other possible temperatures) when transporting the accommodating system 100, the third temperature ($T_3$) may be a lowest temperature (e.g., 0° C., −25° C., or other possible temperatures) when transporting the accommodating system 100. That is, the second temperature is higher than the first temperature ($T_2 > T_1$), and the third temperature is lower than the first temperature ($T_3 < T_1$).

In some embodiments, the first temperature, the second temperature and the third temperature may be the actual temperature of the accommodating system 100; or the first temperature, the second temperature and the third temperature may be the estimated temperature (estimated manually or with computer devices, etc.) of the location where the accommodating system 100 may be located. In some embodiments, some of the first temperature, the second temperature, or the third temperature may be the actual temperature of the location where the accommodating system 100 is located, and the remaining first temperature, the second temperature, or the third temperature may be estimated temperature (estimated manually or with computer devices, etc.) of the accommodating system 100. Since the route during the transportation may be determined in advance, the location and temperature during the transportation may be estimated manually or with computer devices. In a specific embodiment, the first temperature is, for example, the temperature of a warehouse before transportation. The second temperature is, for example, the temperature of a container or a freezer arrived near the port or airport.

When the accommodating system 100 will not be in the environment that is lower than the first temperature, the temperature change may be the absolute value of the difference between the second temperature and the first temperature ($\Delta T = |T2 - T1|$). Please note that the temperature change may be sensed by a temperature sensor.

When the accommodating system 100 may be in the environment that is lower than the first temperature, the temperature change may be the absolute value of the difference between the second temperature and the third temperature ($\Delta T = |T2 - T3|$), or the temperature change may be the absolute value of the difference between the second temperature and the first temperature ($\Delta T = |T2 - T1|$). Please note that the temperature change may be sensed by a temperature sensor.

It may be known from the volumetric thermal expansion formula that the volume change of the liquid accommodating chamber 112 when subjecting to the temperature change is: $\Delta V_A = V_A \times (1+V_{A,E} \times \Delta T)$; and the volume change of the liquid L when subjecting to the temperature change is: $\Delta V_L = V_L \times (1+V_{L,E} \times \Delta T)$.

To protect the accommodating device 110 from damage, the volume change of the liquid L when subjecting to temperature change is equal to the volume change of the liquid accommodating chamber 112 when subjecting to the temperature change, and therefore subjects to the following relationships: $\Delta V_A = \Delta V_L$. That is: $V_A \times (1+V_{A,E} \times \Delta T) = V_L \times (1+V_{L,E} \times \Delta T)$.

Thus, one may obtain the liquid volume at the first temperature is: $V_L = V_A \times [(1+V_{A,E} \times \Delta T)/(1+V_{L,E} \times \Delta T)]$.

Moreover, the ratio of the liquid accommodating chamber volume is: $V_L/V_A = (1+V_{A,E} \times \Delta T)/(1+V_{L,E} \times \Delta T)$.

In general, the liquid volumetric thermal expansion coefficient is greater than the liquid accommodating chamber volumetric thermal expansion coefficient ($V_{A,E} > V_{L,E}$). Thus, at the first temperature, the liquid volume is required to be less than the liquid accommodating chamber volume ($V_L < V_A$). That is, the liquid volume is $(1+V_{A,E} \times \Delta T)/(1+V_{L,E} \times \Delta T)$ times of the liquid accommodating chamber volume. Thus, after the accommodating system 100 is subjected to the temperature change, or when the accommodating system 100 is at the second temperature, the expanded liquid volume will not be greater than the expanded liquid accommodating chamber volume, and the accommodating system 100 is protected from being damaged. Moreover, the accommodating system 100 accommodates a maximum allowable amount of the liquid L, so that the user only needs to fill a minimum amount of the liquid L into the liquid accommodating chamber 112 of the accommodating device 110.

In one embodiment, the housing 111 is made of aluminum, and the liquid L is a 50% ethylene glycol aqueous solution by volume. The relationship between the defined names, the representative symbols and the values in the formula are listed in Table 2 below.

TABLE 2

| Defined name | Representative symbol | Value |
| --- | --- | --- |
| Liquid accommodating chamber thermal volumetric expansion coefficient | $V_{A,E}$ | $69 \times 10^{-6}$ |
| Liquid volumetric thermal expansion coefficient | $V_{L,E}$ | $741 \times 10^{-6}$ |
| First temperature | $T_1$ | 25° C. |
| Second temperature | $T_2$ | 100° C. |

The temperature change is the absolute value of the difference between the second temperature and the first temperature: $\Delta T = |T_2 - T_1| = |100°\text{ C.} - 25°\text{ C.}| = 75°\text{ C.}$ The ratio of the liquid volume to the liquid accommodating chamber volume is: $V_L/V_A = (1+V_{A,E} \times \Delta T)/(1+V_{L,E} \times \Delta T) = (1+69 \times 10^{-6} \times 75)/(1+741 \times 10^{-6} \times 75) = 95.2\%$.

That is, in this embodiment, at the first temperature, the liquid volume is 95.2% of the liquid accommodating chamber volume. Thus, when the accommodating system 100 is at the second temperature (100° C.), the liquid volume is not greater than the liquid accommodating chamber volume, and the accommodating system 100 is not damaged.

Figure 2:
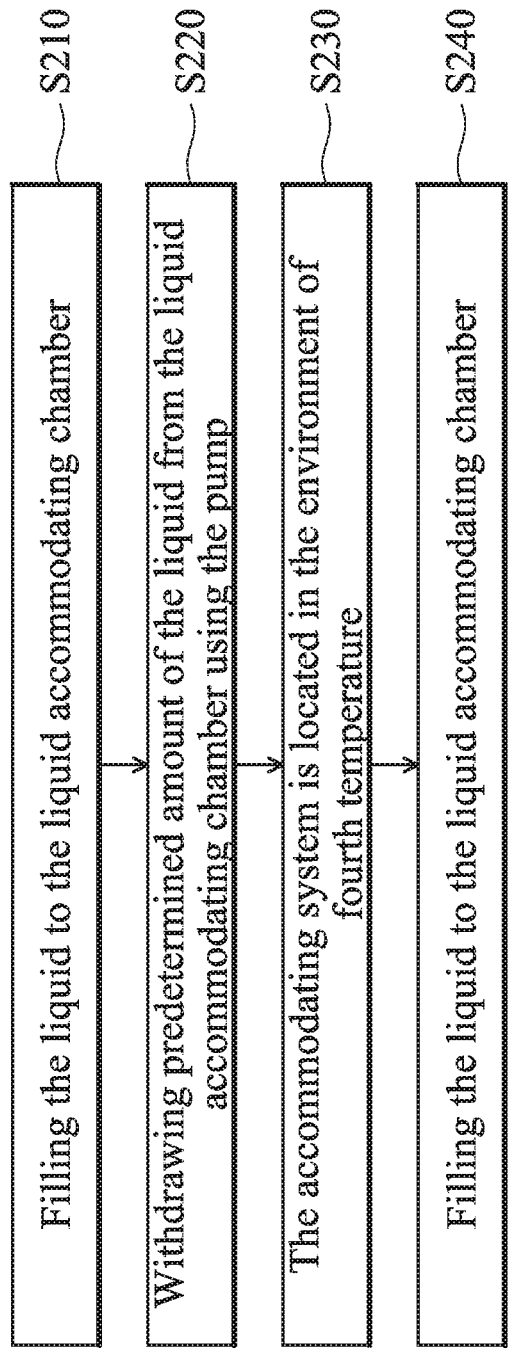
FIG. 2 shows a filling method for the accommodating system according to some embodiments of the present disclosure.

Please refer to FIG. 2, FIG. 2 shows a filling method 200 for the accommodating system 100 according to some embodiments of the present disclosure. The filling method 200 may include an operation S210, an operation S220, an operation S230, and an operation S240.

In the operation S210, the accommodating system 100 is at the first temperature (e.g. located at the warehouse before transportation), and is filled with the liquid L from the external source to the liquid accommodating chamber 112 of the accommodating device 110. In the operation S210, the liquid L may be filled into the liquid accommodating chamber 112 of the accommodating device 110 via the liquid inlet 113 until the liquid accommodating chamber 112 of the accommodating device 110 is full of the liquid L. The pressure of the external source may be greater than the pressure within the liquid accommodating chamber 112, so that the liquid L may automatically flow from the external source into the liquid accommodating chamber 112 via the liquid inlet 113. Alternatively, the liquid L may be pumped from the external source into the liquid accommodating chamber 112 using another pump (not shown).

In the operation S220, the accommodating system 100 is at the first temperature, and a predetermined amount of the liquid L is withdrawn from the liquid accommodating chamber 112 of the accommodating device 110 using the pump 120. In the operation S220, the predetermined amount of the liquid L is withdrawn from the liquid accommodating chamber 112 of the accommodating device 110 via the liquid outlet 114 using the vacuum pump 120, and no external air enters the accommodating device 110. It may be known from above calculated liquid volume, the liquid volume in the accommodating chamber 112 is: $V_L = V_A \times [(1+V_{A,E} \times \Delta T)/(1+V_{L,E} \times \Delta T)]$. Therefore, the predetermined amount (the representative symbol in the formula is: $V_S$) of liquid L withdrawn from the liquid accommodating chamber 112 is: $V_S = V_L - V_A = V_A \times [1-(1+V_{A,E} \times \Delta T)/(1+V_{L,E} \times \Delta T)]$.

In the operation S230, the accommodating system 100 is located in the environment of a fourth temperature (the representative symbol in the formula is: $T_4$). The fourth temperature represents the temperature during actual transportation. If the range of the fourth temperature is between less than or equal to the second temperature and greater than or equal to the third temperature ($T_3 \leq T_4 \leq T_2$). According to the above calculation, the expanded volume of the liquid L will not be greater than the expanded volume (the space for accommodating the liquid) of the liquid accommodating chamber 112, and the accommodating system 100 is not damaged.

Upon arrival at the destination, the accommodating system 100 may be at a fifth temperature. At this time, the operation S240 is performed, and the liquid L is filled into the liquid accommodating chamber 112 of the accommodating device 110 until the liquid accommodating chamber 112 of the accommodating device 110 is full of liquid L. In an embodiment, the pressure of the liquid accommodating chamber 112 of the accommodating device 110 is less than the external pressure since the vacuum pump 120 is used in the operation S220. Thus, when performing the operation S240, one only needs to connect the pipeline of the external source to the liquid inlet 113, and the liquid L is automatically filled into the liquid accommodating chamber 112 of the accommodating device 110. The fifth temperature, for example, is the temperature of the warehouse or assembly factory in the destination.

Continuing to the aforementioned embodiments, the housing 111 is made of aluminum, and the liquid L is a 50% ethylene glycol aqueous solution by volume. The relationship between the defined names, the representative symbols and the values in the formula are listed in Table 2 above. If the fifth temperature is set to be equal to the first temperature (which indicates that the temperature before transportation is the same as the temperature after arrival, and aforementioned temperature may be known and set in advance), and it may be known that, according to the aforementioned formula, $V_S=V_A\times(1-95.2\%)=4.8\%\times V_A$. Thus, in the operation S220, one needs to withdraw $4.8\%\times V_A$ of the liquid L from the liquid accommodating chamber 112 of the accommodating device 110 using the pump 120 (vacuum pump 120). Moreover, in the operation S240, the accommodating system 100 is at the fifth temperature (which is the same as the first temperature). Thus, one only needs to fill $4.8\%\times V_A$ of the liquid L to the liquid accommodating chamber 112 of the accommodating device 110.

In general, the accommodating system 100 and the filling method 200 of the embodiments of the present disclosure may enable the accommodating device 110 to accommodate the maximum allowable amount of liquid L, so that the user only needs to fill the minimum amount of liquid L to the liquid accommodating chamber 112 of the accommodating device 110. Moreover, after the accommodating system 100 is subjected to the temperature changes, the volume of the liquid L is not greater than the volume of the liquid accommodating chamber 112, and the accommodating system 100 is not damaged.

Although various examples of the present disclosure are described as above, it should be understood that they are presented only as examples and not as limitations. Various changes may be made to the disclosed examples according to the present disclosure without departing from the real spirit and scope of the present disclosure. Accordingly, the breadth and scope of the present disclosure should not be limited to any of the above examples. On the contrary, the scope of the present disclosure should be define in accordance with the following claims and their equivalents.

Although the present disclosure is illustrated and described according to one or more embodiments, but a person with ordinary skill in the art to which the present disclosure belongs may make equivalent changes and modifications according to the specification and the accompanying drawings of the present disclosure with interpretation and understanding. In addition, although the particular feature of the present disclosure may only disclose one of several embodiments, said feature may be combined with one or more other features of other embodiments for any specific and special application based on needs or advantages.

What is claimed is:

1. A filling method for an accommodating system, comprising:
   filling a liquid into an accommodating device at a first temperature; and
   withdrawing a predetermined amount of the liquid from the accommodating device using a pump,
   wherein the predetermined amount is related to a temperature change sensed by a temperature sensor,
   wherein the temperature change is the absolute value of the difference between a second temperature and a third temperature, the second temperature is higher than the first temperature, and the third temperature is lower than the first temperature,
   wherein the filling method further comprises:
      transporting the accommodating system at a fourth temperature, and the fourth temperature is between the second temperature and the third temperature.

2. The filling method of claim 1, wherein the temperature change is the absolute value of the difference between a second temperature and the first temperature, and the second temperature is higher than the first temperature.

3. The filling method of claim 1, further comprising:
   filling the liquid into the accommodating device at a fifth temperature.

4. The filling method of claim 1, wherein the operation of filling the liquid into the accommodating device comprises:
   filling the liquid into the accommodating device until the accommodating device is full of the liquid.

5. The filling method of claim 1, wherein the operation of withdrawing the predetermined amount of the liquid from the accommodating device using the pump comprises: withdrawing the predetermined amount of the liquid from the accommodating device using a vacuum pump, and no external air enters the accommodating device.

6. The filling method of claim 1, wherein the accommodating device has a liquid accommodating chamber volume and a liquid accommodating chamber volumetric thermal expansion coefficient, the liquid has a liquid volumetric thermal expansion coefficient, and the predetermined amount is: the liquid accommodating chamber volume×[1−(1+the liquid accommodating chamber volumetric thermal expansion coefficient×the temperature change)/(1+the liquid volumetric thermal expansion coefficient×the temperature change)].

7. The filling method of claim 6, wherein the liquid volumetric thermal expansion coefficient is greater than the liquid accommodating chamber volumetric thermal expansion coefficient.

8. The filling method of claim 1, wherein the accommodating device comprises a housing made of aluminum.

9. The filling method of claim 1, wherein the liquid is a 50% ethylene glycol aqueous solution by volume.

10. An accommodating system, comprising:
    an accommodating device, having a liquid accommodating chamber volume and a liquid accommodating chamber volumetric thermal expansion coefficient; and
    a liquid, having a liquid volume and a liquid volumetric thermal expansion coefficient, and being accommodated in the accommodating device,
    wherein the liquid volume is related to a temperature change,
    wherein the temperature change is the absolute value of the difference between a second temperature and a third temperature, the second temperature is higher than the first temperature, and the third temperature is lower than the first temperature,
    wherein the accommodating system experienced a fourth temperature, and the fourth temperature is between the second temperature and the third temperature.

11. The accommodating system of claim 10, wherein the liquid volume is: the liquid accommodating chamber volume×[(1+the liquid accommodating chamber volumetric thermal expansion coefficient×the temperature change)/(1+the liquid volumetric thermal expansion coefficient×the temperature change)].

12. The accommodating system of claim 10, wherein the accommodating device accommodates no external air.

13. The accommodating system of claim 10, the liquid volumetric thermal expansion coefficient is greater than the liquid accommodating chamber volumetric thermal expansion coefficient.

14. The accommodating system of claim 10, wherein the accommodating device comprises a housing made of aluminum.

15. The accommodating system of claim 10, wherein the liquid is a 50% ethylene glycol aqueous solution by volume.

16. The accommodating system of claim 10, wherein the liquid volume is not greater than the liquid accommodating chamber volume.

\* \* \* \* \*